(12) United States Patent
Hayashi

(10) Patent No.: US 11,387,080 B2
(45) Date of Patent: Jul. 12, 2022

(54) SUBSTRATE SUPPORT AND PLASMA PROCESSING APPARATUS

(71) Applicant: TOKYO ELECTRON LIMITED, Tokyo (JP)

(72) Inventor: Daisuke Hayashi, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/032,930

(22) Filed: Sep. 25, 2020

(65) Prior Publication Data

US 2021/0098238 A1 Apr. 1, 2021

(30) Foreign Application Priority Data

Sep. 26, 2019 (JP) .............................. JP2019-175232
Jun. 30, 2020 (JP) .............................. JP2020-112576

(51) Int. Cl.
*H01J 37/32* (2006.01)

(52) U.S. Cl.
CPC .. *H01J 37/32642* (2013.01); *H01J 37/32449* (2013.01); *H01J 37/32715* (2013.01); *H01J 37/32091* (2013.01); *H01J 37/32183* (2013.01); *H01J 2237/2007* (2013.01)

(58) Field of Classification Search
CPC ............ C23C 16/4585; H01J 37/32091; H01J 37/32183; H01J 37/32449; H01J 37/32642; H01J 37/32715; H01J 37/32807; H01J 2237/2007; H01L 21/68742
See application file for complete search history.

(56) References Cited

U.S. PATENT DOCUMENTS

| 6,676,759 | B1* | 1/2004 | Takagi | H01L 21/68735 |
| | | | | 118/728 |
| 9,859,146 | B2* | 1/2018 | Himori | H01L 21/30604 |
| 2010/0086784 | A1* | 4/2010 | Patalay | H01L 21/68742 |
| | | | | 428/411.1 |
| 2019/0341275 | A1* | 11/2019 | Jin | B08B 5/00 |
| 2020/0173018 | A1* | 6/2020 | Hiester | H01L 21/68742 |
| 2020/0219753 | A1* | 7/2020 | Uchida | H01J 37/32642 |
| 2020/0234981 | A1* | 7/2020 | Schmid | H01L 21/3065 |
| 2020/0303233 | A1* | 9/2020 | Lee | H01L 21/67742 |
| 2020/0395195 | A1* | 12/2020 | Sanchez | H01L 21/68735 |
| 2021/0111007 | A1* | 4/2021 | Kim | H01L 21/6833 |

FOREIGN PATENT DOCUMENTS

JP 2018-160666 A 10/2018

* cited by examiner

*Primary Examiner* — Benjamin Kendall
(74) *Attorney, Agent, or Firm* — Weihrouch IP

(57) ABSTRACT

A substrate support is provided. The substrate support includes a main body having a substrate supporting region and an annular region surrounding the substrate supporting region. The substrate support further includes a first ring disposed on the annular region and having a through-hole, a second ring disposed on the first ring and having an inner peripheral surface facing an end surface of a substrate on the substrate supporting region. The substrate support further includes a lift pin including a lower rod and an upper rod, wherein the lower rod has an upper end surface to be in contact with the first ring, and the upper rod extends upward from the upper end surface of the lower rod to be in contact with the second ring through the through-hole of the first ring and has a length greater than a length of the through-hole.

19 Claims, 9 Drawing Sheets

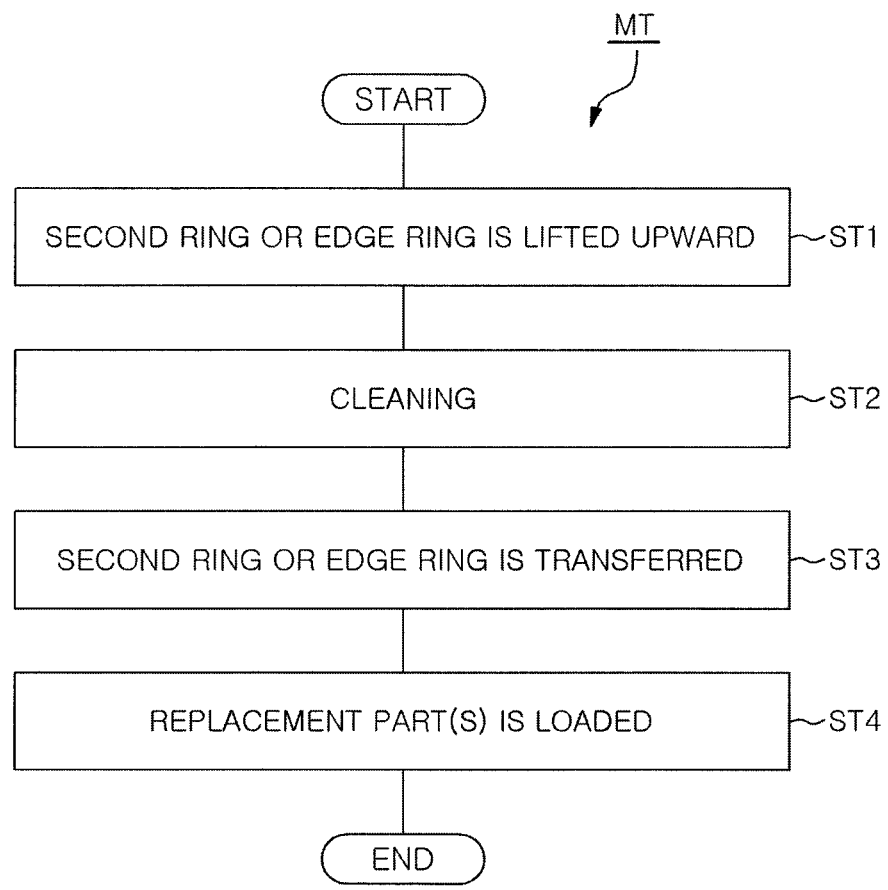

SUBSTRATE SUPPORT AND PLASMA PROCESSING APPARATUS

CROSS-REFERENCE TO RELATED APPLICATIONS

This application claims priority to Japanese Patent Application Nos. 2019-175232 and 2020-112576, respectively filed on Sep. 26, 2019 and Jun. 30, 2020, the entire contents of which are incorporated herein by reference.

TECHNICAL FIELD

The present disclosure relates to a substrate support and a plasma processing apparatus.

BACKGROUND

A plasma processing apparatus performs plasma processing on a substrate. When the plasma processing is performed by the plasma processing apparatus, the substrate is placed on a substrate support and in a region surrounded by an edge ring in a state where the edge ring is placed on the substrate support. The edge ring may be referred to as "focus ring."

Japanese Patent Application Publication No. 2018-160666 discloses a focus ring including a plurality of rings. The rings include a central ring and an outer ring. The central ring can be lifted to adjust characteristics of plasma processing to be performed on an edge of a substrate. The edge ring is lifted by a pusher pin.

The present disclosure provides a technique for lifting only one of two rings forming an edge ring and simultaneously lifting the two rings, with a small number of pins.

SUMMARY

In accordance with an aspect of the present disclosure, there is a substrate support. The substrate support comprises a main body, a first ring, a second ring and a lift pin. The main body has a substrate supporting region and an annular region. The annular region surrounds the substrate supporting region. The first ring is disposed on the annular region and has a through-hole. The second ring is disposed on the first ring and has an inner peripheral surface facing an end surface of a substrate on the substrate supporting region. The lift pin includes a lower rod and an upper rod. The lower rod has an upper end surface to be in contact with the first ring. The upper rod extends upward from the upper end surface of the lower rod to be in contact with the second ring through the through-hole of the first ring and has a length greater than a length of the through-hole.

BRIEF DESCRIPTION OF THE DRAWINGS

The objects and features of the present disclosure will become apparent from the following description of embodiments, given in conjunction with the accompanying drawings, in which:

FIG. 9 is a flowchart of a method including cleaning of an edge ring according to an embodiment.

DETAILED DESCRIPTION

Figure 1:
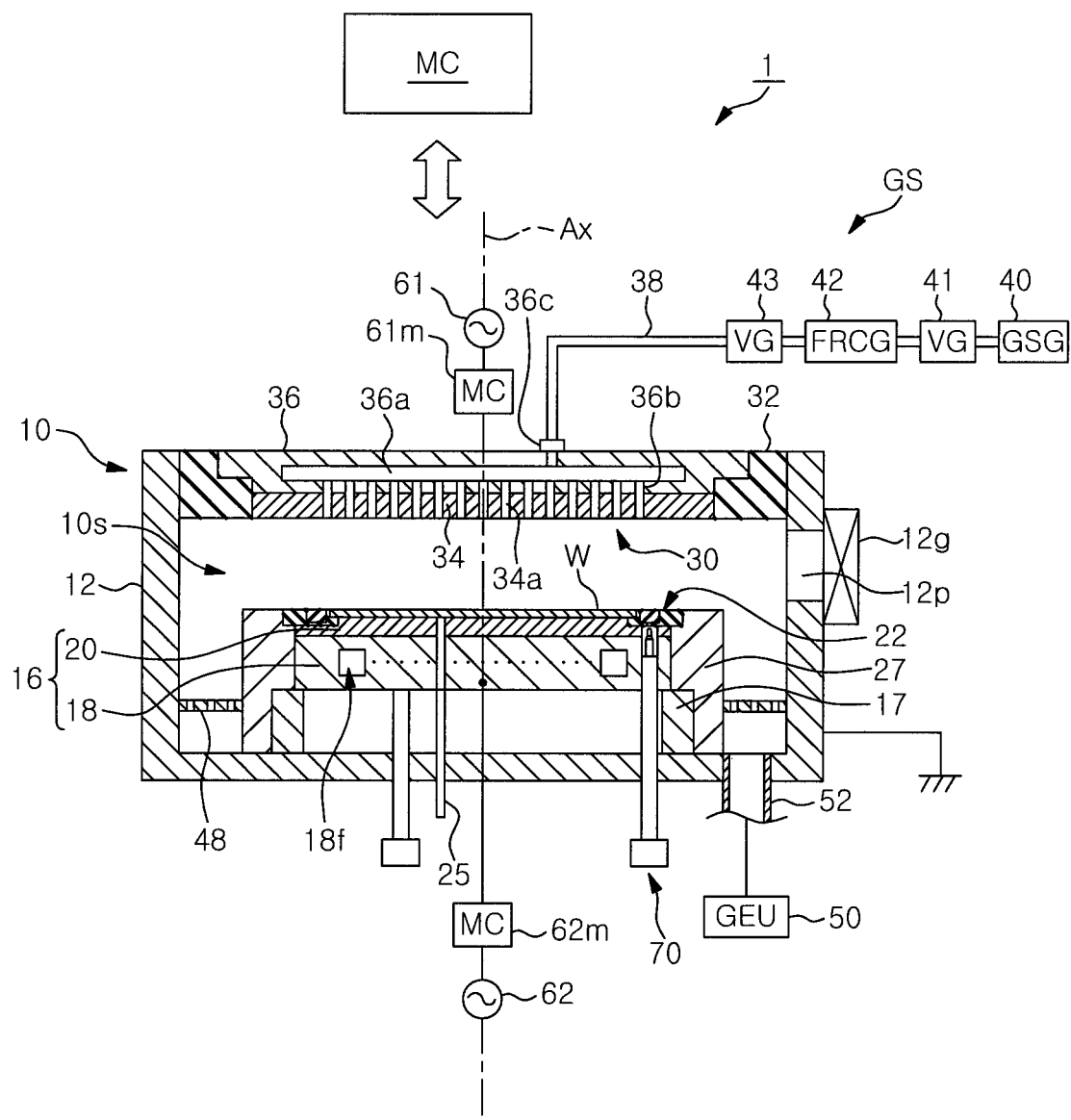
FIG. 1 schematically shows a plasma processing apparatus according to an embodiment.

Hereinafter, various embodiments will be described.

In one embodiment, a substrate support is provided. The substrate support includes a first region, a second region, and a lift mechanism. The second region extends radially outward with respect to the first region and surrounds the first region. The second region supports the edge ring. The edge ring includes a first ring and a second ring. The first ring has a mounting region. The second ring has an inner peripheral surface facing an end surface of the substrate placed on the first region and is placed on the mounting region. A lift mechanism includes a lift pin. The lift mechanism is configured to lift the first ring and the second ring supported by the lift pin. The lift pin has a first columnar portion and a second columnar portion. The first columnar portion has a first upper end surface that can be brought into contact with the first ring. The second columnar portion extends upward from the first columnar portion and is narrowed with respect to the first columnar portion to expose the first upper end surface. The second columnar portion is movable through a through-hole formed in the mounting region. The second columnar portion has a second upper end surface that can be brought into contact with the second ring. A length of the second columnar portion is greater than a vertical thickness of the mounting region.

In the substrate support of the above embodiment, only the second ring in contact with the second upper end surface of the lift pin can be lifted by the lift mechanism in a state where the first upper end surface of the lift pin is not in contact with the first ring. Further, both of the first ring and the second ring can be simultaneously lifted upward from the substrate support by the lift mechanism in a state where the first upper end surface is in contact with the first ring and the second upper end surface is in contact with the second ring. Therefore, in accordance with the substrate support of the above embodiment, it is possible to lift only one of the two rings forming the edge ring and to simultaneously lift the two rings with a small number of lift pins.

In one embodiment, each of the first columnar portion and the second columnar porting may have a cylindrical shape. In this embodiment, a diameter of the first columnar portion is greater than that of the second columnar porting.

In one embodiment, the second columnar portion may have a first portion and a second portion. In this embodiment, the first portion extends upward from the first columnar portion. The second portion extends upward from the first columnar portion and has a second end surface. A width/diameter of the first portion is greater than that of the second portion. In this embodiment, the first ring is supported by the lift pin in a state where the first portion of the second columnar portion is partially disposed in the through-hole of the mounting region. The first portion is a portion of the second columnar portion that has a relatively large width. Therefore, the movement of the first ring with respect to the lift pin in the horizontal plane is suppressed. Accordingly, the positioning accuracy of the first ring on the substrate support is improved.

In one embodiment, each of the first columnar portion, the first portion, and the second portion may have a cylindrical shape. In this embodiment, a diameter of the first columnar portion is greater than that of the first portion, and a diameter of the first portion is greater than that of the second portion.

In one embodiment, the second columnar portion may further have a third portion extending between the first portion and the second portion. The third portion may have a tapered surface.

In one embodiment, the tip end of the second columnar portion including the second upper end surface may be tapered to be fitted into the tapered recess of the second ring. In this embodiment, the second ring is supported by the lift pin in a state where the tip end of the second columnar portion of the lift pin is fitted into the recess of the second ring. Therefore, the movement of the second ring with respect to the lift pin in the horizontal plane is suppressed. Accordingly, the accuracy of the positioning of the second ring with respect to the lift pin is improved, which results in improvement of the positioning accuracy of the second ring on the first ring and the substrate support.

In another embodiment, a plasma processing apparatus is provided. The plasma processing apparatus includes a chamber and a substrate support. The substrate support is any one of the substrate supports of the above-described various embodiments and is configured to support a substrate in a chamber.

In one embodiment, the plasma processing apparatus may further include a gas supply unit, an energy source, and a controller. The gas supply unit is configured to supply a gas into the chamber. The energy source is configured to provide energy to generate plasma from the gas in the chamber. The controller is configured to control the lift mechanism, the gas supply unit, and the energy source. The lift mechanism further includes a driving unit configured to raise and lower the lift pin. The controller can control the driving unit such that the edge ring or the second ring supported by the lift pin is lifted upward from the substrate support. The controller can control the gas supply unit to supply a cleaning gas into the chamber in a state where the edge ring or the second ring is lifted above the substrate support and control the energy source to generate plasma from the cleaning gas.

In one embodiment, the plasma processing apparatus may further include another gas supply unit. The another gas supply unit is configured to supply an inert gas into the through-hole that is formed in the second region to allow movement of the lift pin. In accordance with the present embodiment, the discharge in the through-hole in the second region can be suppressed.

Hereinafter, various embodiments will be described in detail with reference to the drawings. Like reference numerals will be given to like or corresponding parts throughout the drawings.

FIG. 1 schematically shows a plasma processing apparatus according to one embodiment. FIG. 1 shows a cross-sectional view of the plasma processing apparatus. A plasma processing apparatus 1 shown in FIG. 1 is a capacitively coupled plasma processing apparatus. The plasma processing apparatus 1 includes a chamber 10. The chamber 10 has an inner space 10s. A central axis of the inner space 10s is an axis AX extending in a vertical direction.

In one embodiment, the chamber 10 includes a chamber main body 12. The chamber main body 12 has a substantially cylindrical shape. The inner space 10s is disposed in the chamber main body 12. The chamber main body 12 is made of, e.g., aluminum. The chamber main body 12 is electrically grounded. A plasma resistant film is formed on an inner wall surface of the chamber main body 12, i.e., a wall surface that defines the inner space 10s. The plasma resistant film may be a film formed by anodic oxidation treatment or a ceramic film such as a film made of yttrium oxide.

A passage 12p is formed at a sidewall of the chamber main body 12. A substrate W is transferred through the passage 12p when the substrate W is transferred between the inner space 10s and the outside of the chamber 10. A gate valve 12g is disposed along the sidewall of the chamber main body 12 to open and close the passage 12p.

Figure 2:
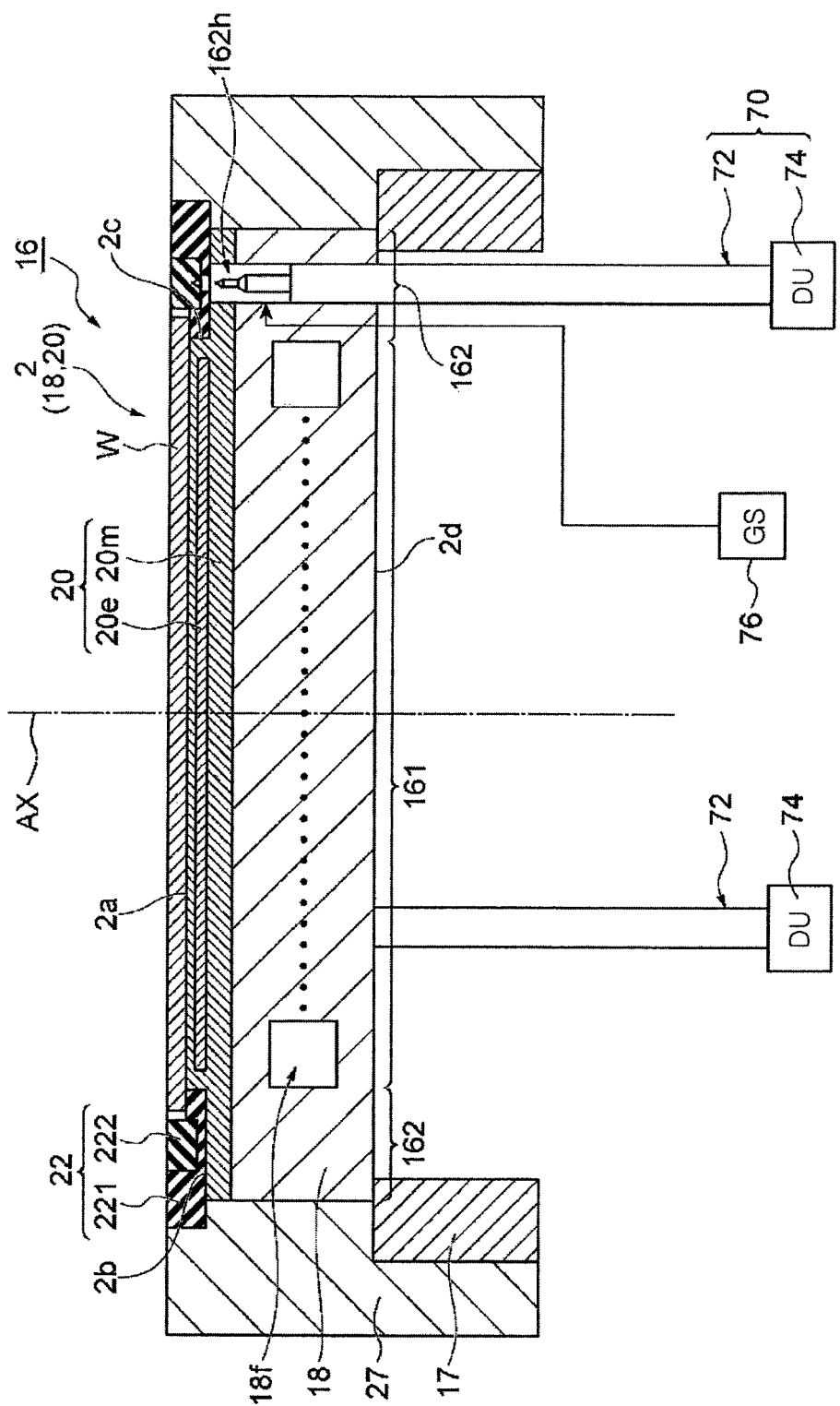
FIG. 2 schematically shows a substrate support according to an embodiment.
Figure 3:
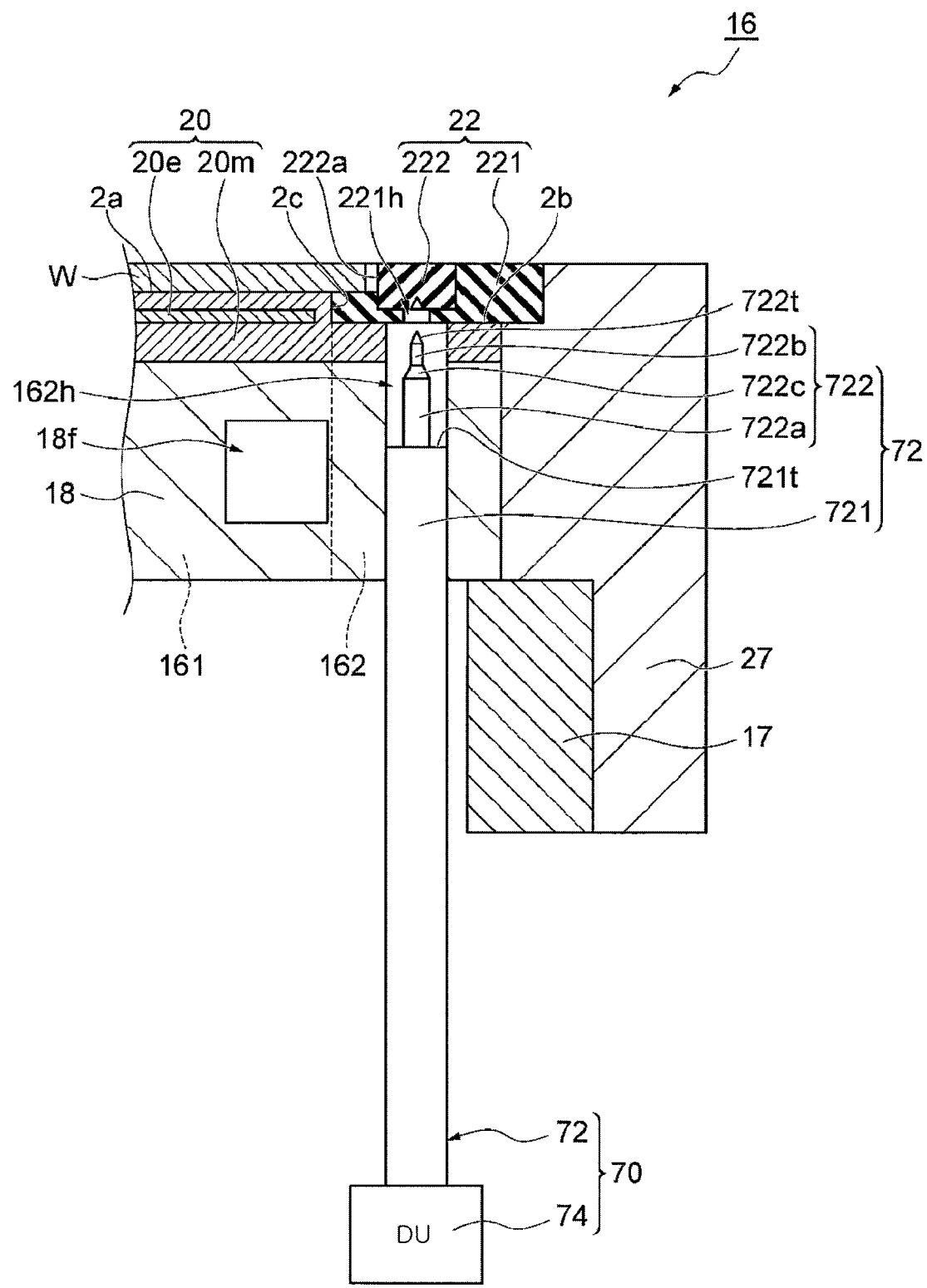
FIG. 3 is a partial enlarged view of the substrate support according to an embodiment.

The plasma processing apparatus 1 further includes a substrate support 16. Hereinafter, FIGS. 2 and 3 will be referred to together with FIG. 1. FIG. 2 schematically shows a substrate support according to one embodiment. FIG. 3 is a partial enlarged view of the substrate support according to the embodiment. FIG. 3 shows a cross-sectional view of the substrate support. The substrate support 16 is configured to support a substrate W placed thereon in the chamber 10. The substrate W has a substantially disc shape. The substrate support 16 is supported by a supporting part 17. The supporting part 17 extends upward from a bottom portion of the chamber 10. The supporting part 17 has a substantially cylindrical shape. The supporting part 17 is made of an insulating material such as quartz.

The substrate support 16 has a first region 161 and a second region 162. The first region 161 supports the substrate W placed thereon. The first region 161 is a substantially circular region in plan view. A central axis of the first region 161 is the axis AX. In one embodiment, the first region 161 includes a base 18 and an electrostatic chuck 20. In one embodiment, the first region 161 may include a part of the base 18 and a part of the electrostatic chuck 20. The base 18 and the electrostatic chuck 20 are disposed in the chamber 10. The base 18 is made of a conductive material such as aluminum and has a substantially disc shape. The base 18 serves as a lower electrode.

In one embodiment, the substrate support 16 includes a main body 2 and an edge ring 22. The main body 2 includes the base 18 and the electrostatic chuck 20. Further, the main body 2 has a substrate supporting region 2a for supporting a substrate W, an annular region 2b for supporting the edge ring 22, and a sidewall 2c extending vertically between the substrate supporting region 2a and the annular region 2b. The annular region 2b surrounds the substrate supporting region 2a. The annular region 2b is located lower than the substrate supporting region 2a. Therefore, an upper end of the sidewall 2c is connected to the substrate supporting region 2a, and a lower end of the sidewall 2c is connected to the annular region 2b.

A flow path 18f is formed in the lower electrode 18. The flow path 18f is a channel for a heat exchange medium. As an example of the heat exchange medium, a liquid coolant or a coolant (e.g., Freon) for cooling the base 18 by vaporization of the coolant is used. A supply device (e.g., a chiller unit) for supplying the heat exchange medium is connected to the flow path 18f. The supply device is disposed outside the chamber 10. The heat exchange medium is supplied from the supply device to the flow path 18f. The heat exchange medium supplied to the flow path 18f is returned to the supply device.

The electrostatic chuck 20 is disposed on the lower electrode 18. When the substrate W is processed in the chamber 10, the substrate W is placed on the first region 161 and held by the electrostatic chuck 20.

The second region 162 extends radially outward with respect to the first region 161 to surround the first region 161. The second region 162 is a substantially annular region in plan view. The edge ring 22 is placed on the second region 162. In one embodiment, the second region 162 may include the base 18. The second region 162 may further include the electrostatic chuck 20. In one embodiment, the second region 162 may include another part of the base 18 and another part of the electrostatic chuck 20. The substrate W is disposed on the electrostatic chuck 20 and in a region surrounded by the edge ring 22. The edge ring 22 will be described in detail later.

A through-hole 162h is formed in the second region 162. In one embodiment, the main body 2 has the through-hole 162h formed between the annular region 2b and a bottom surface 2d of the main body 2. The through-hole 162h is formed in the second region 162 to extend along the vertical direction. In one embodiment, a plurality of through-holes 162h are formed in the second region 162. The number of the through-holes 162h may be the same as the number of lift pins 72 of a lift mechanism 70 to be described later. Each through-hole 162h is aligned with the corresponding lift pin 72 linearly.

The electrostatic chuck 20 includes a main body 20m and an electrode 20e. The main body 20m is made of a dielectric material such as aluminum oxide or aluminum nitride. The main body 20m has a substantially disc shape. A central axis of the electrostatic chuck 20 is the axis AX. The electrode 20e is disposed in the main body 20m. The electrode 20e has a film shape. A DC power supply is electrically connected to the electrode 20e through a switch. When a voltage from the DC power supply is applied to the electrode 20e, an electrostatic attractive force is generated between the electrostatic chuck 20 and the substrate W. Due to the generated electrostatic attractive force, the substrate W is attracted to and held by the electrostatic chuck 20.

The plasma processing apparatus 1 may further include a gas supply line 25. The gas supply line 25 supplies a heat transfer gas, e.g., He gas, from a gas supply unit to a gap between an upper surface of the electrostatic chuck 20 and a backside (bottom surface) of the substrate W.

The plasma processing apparatus 1 may further include an outer peripheral member 27. The outer peripheral member 27 extends radially outward with respect to the substrate support 16 to surround the substrate support 16 along a circumferential direction. The outer peripheral member 27 may extend radially outward with respect to the supporting part 17 to surround the supporting part 17 along the circumferential direction. The outer peripheral member 27 may include one or more parts. The outer peripheral member 27 may be an insulator such as quartz.

The plasma processing apparatus 1 further includes an upper electrode 30. The upper electrode 30 is disposed above the substrate support 16. The upper electrode 30 together with a member 32 blocks an upper opening of the chamber main body 12. The member 32 has an insulating property. The upper electrode 30 is held at an upper portion of the chamber main body 12 through the member 32.

The upper electrode 30 includes a ceiling plate 34 and a holder 36. A bottom surface of the ceiling plate 34 defines the inner space 10s. The ceiling plate 34 is provided with a plurality of gas injection holes 34a. Each of the gas injection holes 34a penetrates through the ceiling plate 34 in a plate thickness direction (vertical direction). The ceiling plate 34 is made of, e.g., silicon, but is not limited thereto. Alternatively, the ceiling plate 34 may have a structure in which a plasma resistant film is formed on a surface of an aluminum base material. The plasma resistant film may be a film formed by anodic oxidation treatment or a ceramic film made of yttrium oxide.

The holder 36 detachably holds the ceiling plate 34. The holder 36 is made of a conductive material such as aluminum. A gas diffusion space 36a is formed in the holder 36. A plurality of gas holes 36b extend downward from the gas diffusion space 36a. The gas holes 36b communicate with the gas injection holes 34a, respectively. A gas inlet port 36c is formed at the holder 36. The gas inlet port 36c is connected to the gas diffusion space 36a. A gas supply line 38 is connected to the gas inlet port 36c.

A gas source group (GSG) 40 is connected to the gas supply line 38 through a valve group (VG) 41, a flow rate controller group (FRCG) 42, and a valve group (VG) 43. The gas source group 40, the valve group 41, the flow rate controller group 42, and the valve group 43 constitute a gas supply unit GS. The gas source group 40 includes a plurality of gas sources. Each of the valve group 41 and the valve group 43 includes a plurality of valves (e.g., opening/closing valves). The flow rate controller group 42 includes a plurality of flow rate controllers. Each of the flow rate controllers of the flow rate controller group 42 is a mass flow controller or a pressure control type flow rate controller. The gas sources of the gas source group 40 are connected to the gas supply line 38 through the corresponding valves of the valve group 41, the corresponding flow rate controllers of the flow rate controller group 42, and the corresponding valves of the valve group 43. The plasma processing apparatus 1 is configured to supply gases from one or more gas sources selected from among the plurality of gas sources of the gas source group 40 to the inner space 10s at individually controlled flow rates.

A baffle plate 48 is disposed between the substrate support 16 or the outer peripheral member 27 and the sidewall of the chamber main body 12. The baffle plate 48 may be formed by coating ceramic such as yttrium oxide on an aluminum base material, for example. A plurality of through-holes are formed in the baffle plate 48. Below the baffle plate 48, a gas exhaust line 52 is connected to the bottom portion of the chamber main body 12. A gas exhaust unit (GEU) 50 is connected to the gas exhaust line 52. The gas exhaust unit 50 includes a pressure controller such as an automatic pressure control valve, and a vacuum pump such as a turbo molecular pump to thereby decrease a pressure in the inner space 10s.

The plasma processing apparatus 1 may further include a radio frequency power supply 61. The radio frequency power supply 61 is configured to generate a radio frequency power (hereinafter, referred to as "first radio frequency power"). The first radio frequency power is used for generating plasma from a gas in the chamber 10. The first radio frequency power has a first frequency within a range of 27 MHz to 100 MHz. The radio frequency power supply 61 is connected to the upper electrode 30 through a matching circuit (MC) 61m. The matching circuit 61m is configured to match an output impedance of the radio frequency power supply 61 and an impedance of a load side (upper electrode 30 side). The radio frequency power supply 61 may not be electrically connected to the upper electrode 30 and may be connected to the base 18 (i.e., lower electrode) through the matching circuit 61m.

The plasma processing apparatus 1 further includes a radio frequency power supply 62. The radio frequency power supply 62 is configured to generate a radio frequency power (hereinafter, referred to as "second radio frequency power") for attracting ions from plasma to the substrate W. The second radio frequency power has a second frequency lower than the first frequency. The second frequency is within, e.g., a range of 400 kHz to 13.56 MHz. The radio frequency power supply 62 is connected to the base 18 (i.e., lower electrode) through a matching circuit (MC) 62m. The matching circuit 62m is configured to match an output impedance of the radio frequency power supply 62 and the impedance of the load side (the base 18 side).

The plasma processing apparatus 1 further includes a controller MC. The controller MC is a computer including a processor, a storage device, an input device, a display device, and the like, and controls the respective components of the plasma processing apparatus 1. The controller MC executes a control program stored in the storage device, and controls the respective components of the plasma processing apparatus 1 based on a recipe data stored in the storage device. A process specified by the recipe data is executed in the plasma processing apparatus 1 under the control of the controller MC.

Figure 4:
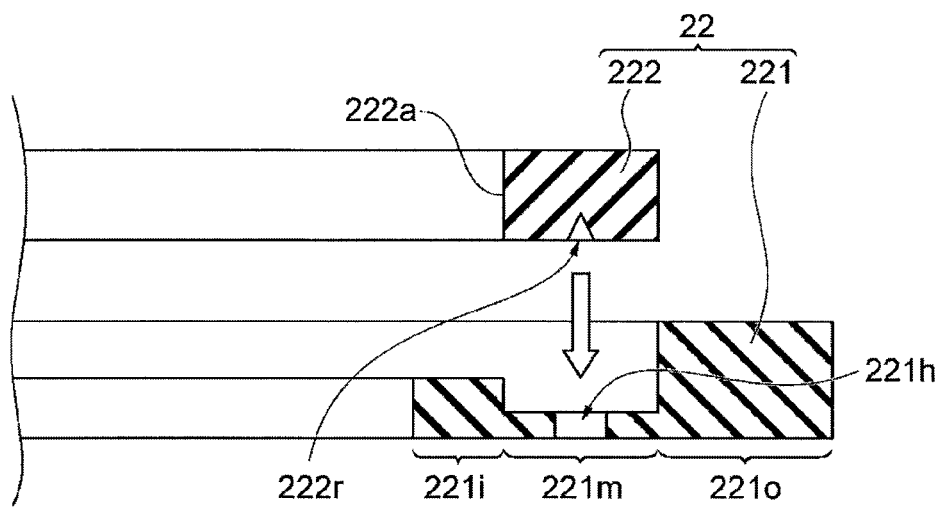
FIG. 4 is a partial enlarged cross-sectional view of an edge ring according to an embodiment.

Hereinafter, the edge ring 22 and the substrate support 16 will be described in detail with reference to FIG. 4 together with FIGS. 1 to 3. FIG. 4 is a partially enlarged cross-sectional view of an edge ring according to an embodiment. The edge ring 22 includes a first ring 221 and a second ring 222. FIG. 4 shows a state in which the first ring 221 and the second ring 222 are separated from each other.

Each of the first ring 221 and the second ring 222 is a ring-shaped member. Each of the first ring 221 and the second ring 222 is made of a material that is appropriately selected depending on a plasma processing performed by the plasma processing apparatus 1. Each of the first ring 221 and the second ring 222 is made of, e.g., silicon or silicon carbide.

The first ring 221 is placed on the second region 162 such that the central axis thereof is located on the axis AX. In one embodiment, the first ring 221 is disposed on the annular region 2b of the main body 2. In one embodiment, the first ring 221 may be placed on the second region 162 or on the electrostatic chuck 20. The first ring 221 may be placed on a component other than the electrostatic chuck 20 in the second region 162. In one embodiment, as shown in FIG. 4, the first ring 221 includes an inner peripheral region (inner portion) 221i, a mounting region (intermediate portion) 221m, and an outer peripheral region (outer portion) 221o. Each of the inner peripheral region 221i, the mounting region 221m, and the outer peripheral region 221o is an annular region extending around the central axis of the first ring 221.

As shown in FIGS. 1 to 3, the inner peripheral region 221i is disposed closer to the central axis of the first ring 221 than the mounting region 221m and the outer peripheral region 221o, and extends along the circumferential direction. The outer peripheral region 221o extends radially outward with respect to the inner peripheral region 221i and the mounting region 221m. In a state where the substrate W is placed on the electrostatic chuck 20, the edge of the substrate W extends to a position on or above the inner peripheral region 221i. The outer peripheral region 221o is spaced radially outward from the edge of the substrate W.

The mounting region 221m extends in the circumferential direction between the inner peripheral region 221i and the outer peripheral region 221o. A through-hole 221h is formed in the mounting region 221m. The through-hole 221h is formed in the mounting region 221m to extend along the vertical direction. In one embodiment, a plurality of through-holes 221h are formed in the mounting region 221m. The number of the through-holes 221h may be the same as the number of the lift pins 72 of the lift mechanism 70.

Each through-hole 221h has a size that does not allow a first columnar portion 721 of the corresponding lift pin 72 to pass therethrough and allows a second columnar portion 722 of the corresponding lift pin 72 to pass therethrough. The first columnar portion 721 and the second columnar portion 722 will be described later. When each of the first columnar portion 721 and the second columnar portion 722 has a cylindrical shape, each through-hole 221h has a diameter smaller than that of the first columnar portion 721 and slightly greater than that of the second columnar portion 722 (or a first portion 722a to be described later). The first ring 221 is disposed on the second region 162 such that each through-hole 221h is aligned with the corresponding lift pin 72 linearly.

The upper surface of the mounting region 221m extends at a position lower than the upper surface of the inner peripheral region 221i and the upper surface of the outer peripheral region 221o. Therefore, the first ring 221 defines a recess on the mounting region 221m. The second ring 222 is placed on the mounting region 221m to be fitted into the recess on the mounting region 221m. In a state where the substrate W is placed on the electrostatic chuck 20, the inner peripheral surface of the second ring 222 faces the end surface of the substrate W.

In one embodiment, the intermediate portion 221m is disposed at an outer periphery of the inner portion 221i, and the outer portion 221o is disposed at an outer periphery of the intermediate portion 221m. In other words, the intermediate portion 221m is disposed between the inner portion 221i and the outer portion 221o. The inner portion 221i has an upper surface, a bottom surface, an inner peripheral surface, and an outer peripheral surface. The intermediate portion 221m has an upper surface and a bottom surface. The outer portion 221o has an upper surface, a bottom surface, an inner peripheral surface, and an outer peripheral surface. The bottom surface of the inner portion 221i, the bottom surface of the intermediate portion 221m, and the bottom surface of the outer portion 221o form a single horizontal plane on the bottom surface of the first ring 221. Further, the upper surface of the inner portion 221i is higher than the upper surface of the intermediate portion 221m, and the upper surface of the outer portion 221o is higher than the upper surface of the inner portion 221i and the upper surface of the intermediate portion 221m. In other words, the inner portion 221i has a thickness smaller than that of the outer portion 221o in the vertical direction. Further, the intermediate portion 221m has a thickness smaller than that of the inner portion 221i and that of the outer portion 221o in the vertical direction. The substrate supporting region 2a of the main body 2 has an area smaller than that of the substrate W, and the upper surface of the inner portion 221i faces a part of the backside of the substrate W on the substrate supporting region 2a. The inner peripheral surface of the inner portion 221i faces the sidewall 2c of the main body 2. The outer peripheral surface of the inner portion 221i is connected to an inner peripheral end portion of the upper surface of the intermediate portion 221m. The inner peripheral surface of the outer portion 221o is connected to an outer peripheral end portion of the upper surface of the intermediate portion 221m. In other words, the first ring 221 has a recess defined by the outer peripheral surface of the inner portion 221i, the upper surface of the intermediate portion 221m, and the inner peripheral surface of the outer portion 221o.

The bottom surface of the second ring 222 is substantially flat. In one embodiment, as shown in FIG. 4, the bottom surface of the second ring 222 further includes a tapered surface, and the tapered surface defines a recess 222r. In one embodiment, the bottom surface of the second ring 222 defines a plurality of recesses 222r. The number of the tapered surfaces of the second ring 222 and the number of the recesses 222r may be the same as the number of the lift pins 72 of the lift mechanism 70. Each recess 222r has a size that allows a tip end of the second columnar portion 722 of the corresponding lift pin 72 to be fitted thereinto. The second ring 222 is disposed on the mounting region 221m such that each recess 222r is aligned with the corresponding lift pin 72 and the corresponding through-hole 221h linearly.

In one embodiment, the second ring 222 is accommodated in the recess of the first ring 221. In other words, the second ring 222 is disposed on the upper surface of the intermediate portion 221m of the first ring 221. In one embodiment, when the first ring 221 and the second ring 222 are disposed on the annular region 2b, the upper surface of the outer portion 221o of the first ring 221 and the upper surface of the second ring 222 have substantially the same height as that of the upper surface of the substrate W on the substrate supporting region 2a. Further, when the first ring 221 and the second ring 222 are disposed on the annular region 2b, an inner peripheral surface 222a of the second ring 222 faces the end surface of the substrate W on the substrate supporting region 2a.

As shown in FIGS. 1 to 3, the substrate support 16 further includes the lift mechanism 70. The lift mechanism 70 includes the lift pin 72 and is configured to lift the first ring 221 and the second ring 222. In one embodiment, the lift mechanism 70 includes a plurality of lift pins 72. The number of the lift pins 72 in the lift mechanism 70 may vary as long as the edge ring 22 can be supported and lifted. The number of the lift pins 72 of the lift mechanism 70 is, e.g., three.

Each lift pin 72 may be made of an insulating material. Each lift pin 72 may be made of, e.g., sapphire, alumina, quartz, silicon nitride, aluminum nitride, or resin. Each lift pin 72 includes the first columnar portion (lower rod) 721 and the second columnar portion (upper rod) 722. The first columnar portion 721 extends in the vertical direction. The first columnar portion 721 has a first upper end surface 721t. The first upper end surface 721t can be brought into contact with the bottom surface of the first ring 221.

The second columnar portion 722 extends vertically upward from the first columnar portion 721. The second columnar portion 722 is narrowed with respect to the first columnar portion 721 to expose the first upper end surface 721t. In one embodiment, each of the first columnar portion 721 and the second columnar portion 722 has a cylindrical shape. In the present embodiment, a diameter of the first columnar portion 721 is greater than that of the second columnar portion 722. The second columnar portion 722 is vertically movable through the through-hole 221h of the mounting region 221m. A vertical length of the second columnar portion 722 is greater than a vertical thickness of the mounting region 221m.

The second columnar portion 722 has a second upper end surface 722t. The second upper end surface 722t can be brought into contact with the second ring 222. In one embodiment, a tip end of the second columnar portion 722 including the second upper end surface 722t may be tapered to be fitted into the corresponding recess 222r.

In one embodiment, the second columnar portion 722 may include a first portion 722a and a second portion 722b. The first portion 722a has a columnar shape and extends upward from the first columnar portion 721. The second portion 722b has a columnar shape and extends to a position above the first portion 722a. The second portion 722b has the second upper end surface 722t. In the present embodiment, a width of the first portion 722a is greater than that of the second portion 722b.

In one embodiment, each of the first columnar portion 721, the first portion 722a, and the second portion 722b may has a cylindrical shape. In the present embodiment, a diameter of the first columnar portion 721 is greater than that of the first portion 722a, and a diameter of the first portion 722a is greater than that of the second portion 722b.

In one embodiment, the second columnar portion 722 may further include a third portion 722c. The third portion 722c extends between the first portion 721a and the second portion 722b. In the present embodiment, the third portion 722c has a tapered surface.

In one embodiment, the lift mechanism 70 includes one or more driving units (DU) 74. The driving units 74 are configured to raise and lower the lift pins 72. Each of the driving units 74 may include, e.g., a motor.

In one embodiment, as shown in FIG. 2, the plasma processing apparatus 1 may further include another gas supply unit (GS) 76. The gas supply unit 76 supplies a gas to each through-hole 162h to prevent discharge in each through-hole 162h. The gas supplied from the gas supply unit 76 into each through-hole 162h is an inert gas. The gas supplied from the gas supply unit 76 into each through-hole 162h is, e.g., He gas.

In one embodiment, the lower rod 721 has an upper end surface 721t that can be brought into contact with the first ring 221. Further, the upper rod 722 extends upward from the upper end surface 721t of the lower rod 721. Moreover, the upper rod 722 can be brought into contact with the second ring 222 through the through-hole 221h of the first ring 221, and has a length greater than that of the through-hole 221h.

In one embodiment, the upper rod 722 is thinner than the lower rod 721.

In one embodiment, each of the lower rod 721 and the upper rod 722 has a cylindrical shape, and a diameter of the lower rod 721 is greater than that of the upper rod 722.

In one embodiment, the upper rod 722 has a first portion 722a extending upward from the lower rod 721 and a second portion 722b extending upward from the first portion 722a and having a tip end 722t. The first portion 722a is thicker than the second portion 722b.

In one embodiment, the lower rod 721, the first portion 722a, and the second portion 722b have a cylindrical shape. The first portion 722a has a diameter smaller than that of the lower rod 721 and greater than that of the second portion 722b.

In one embodiment, the upper rod 722 includes a tapered portion 722c between the first portion 722a and the second portion 722b.

In one embodiment, the second ring 222 has a recess 222r into which the tip end 722t of the upper rod 722 is fitted.

Figure 5:
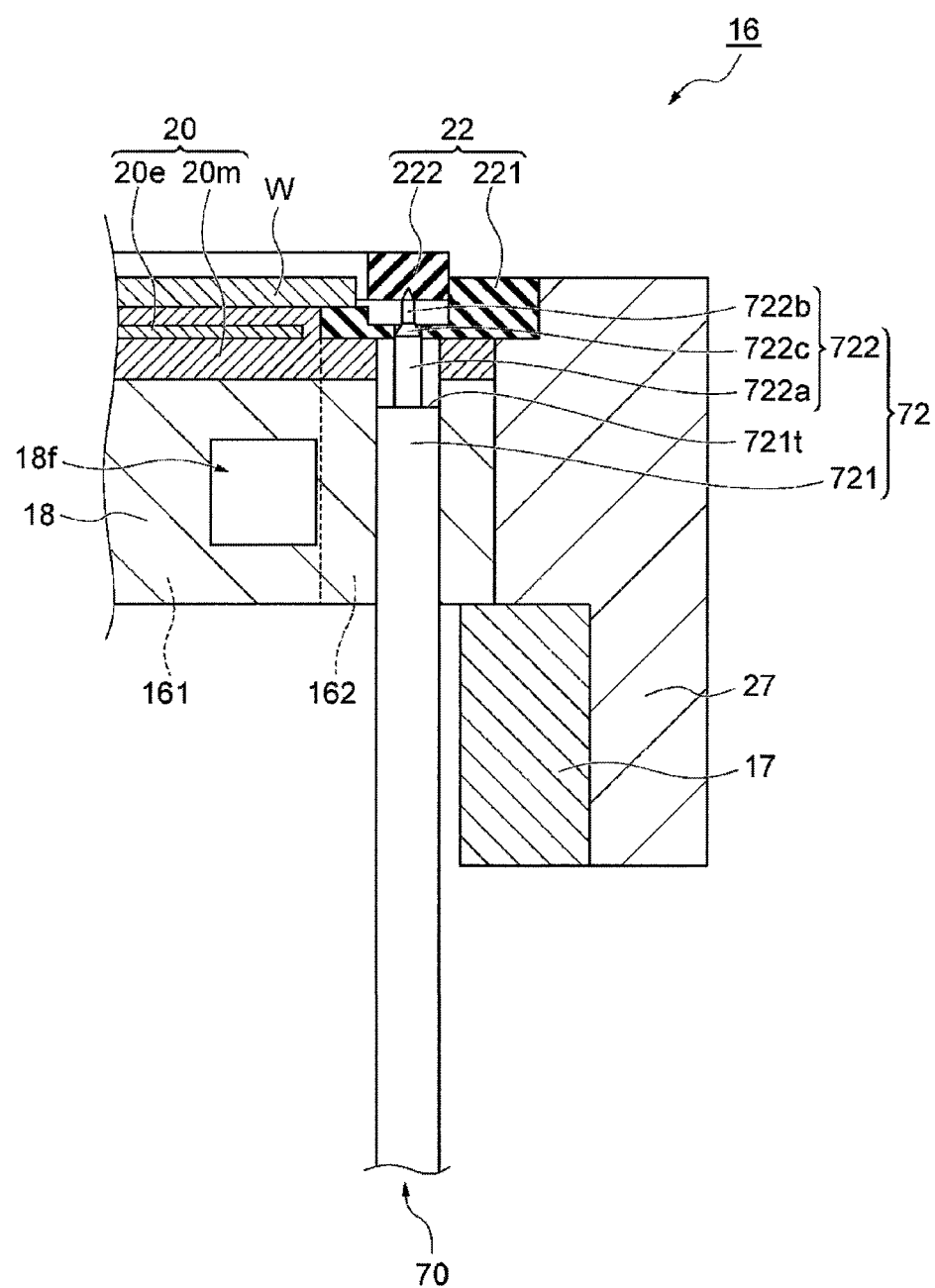
FIGS. 5 to 8 are partial enlarged views of the substrate support according to an embodiment.
Figure 6:
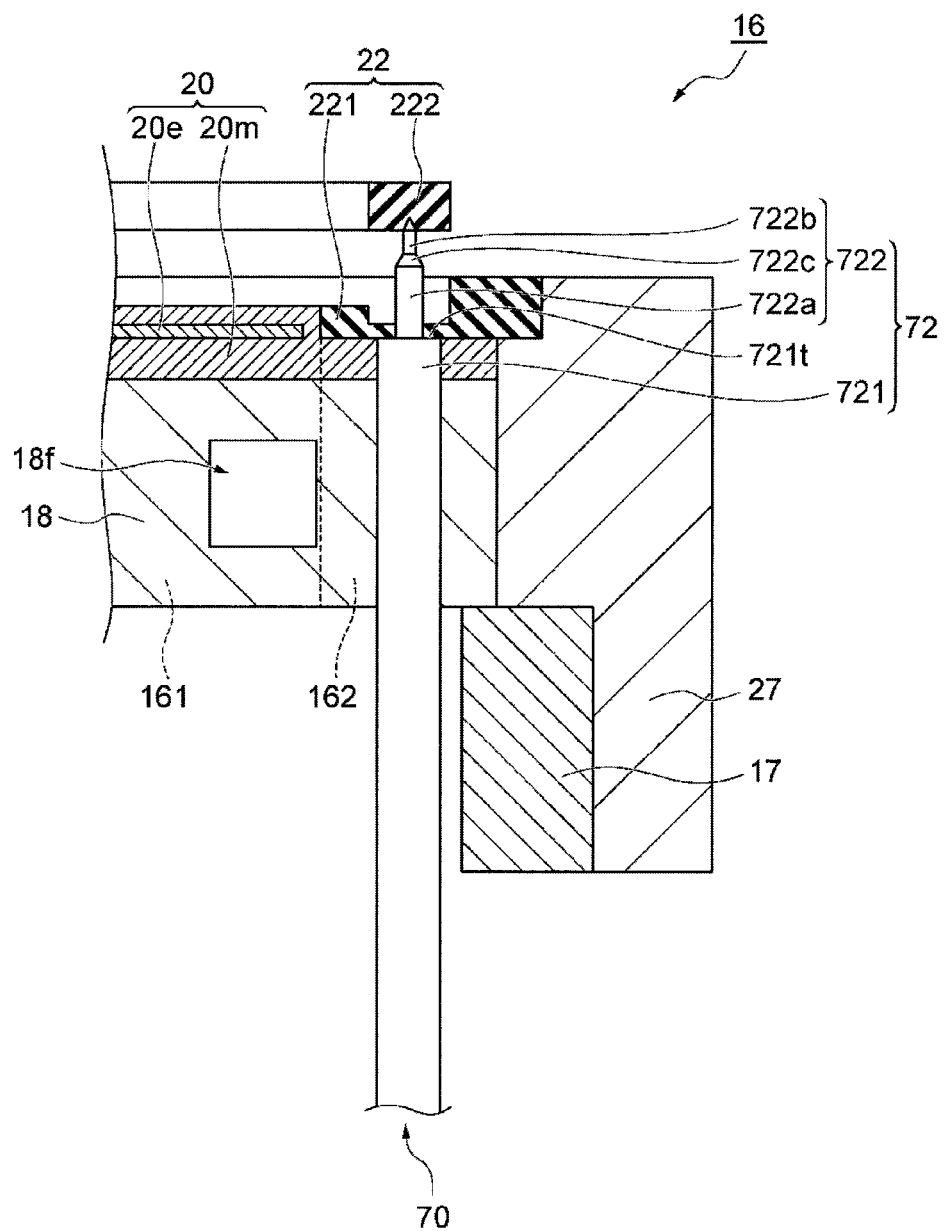
Figure 7:
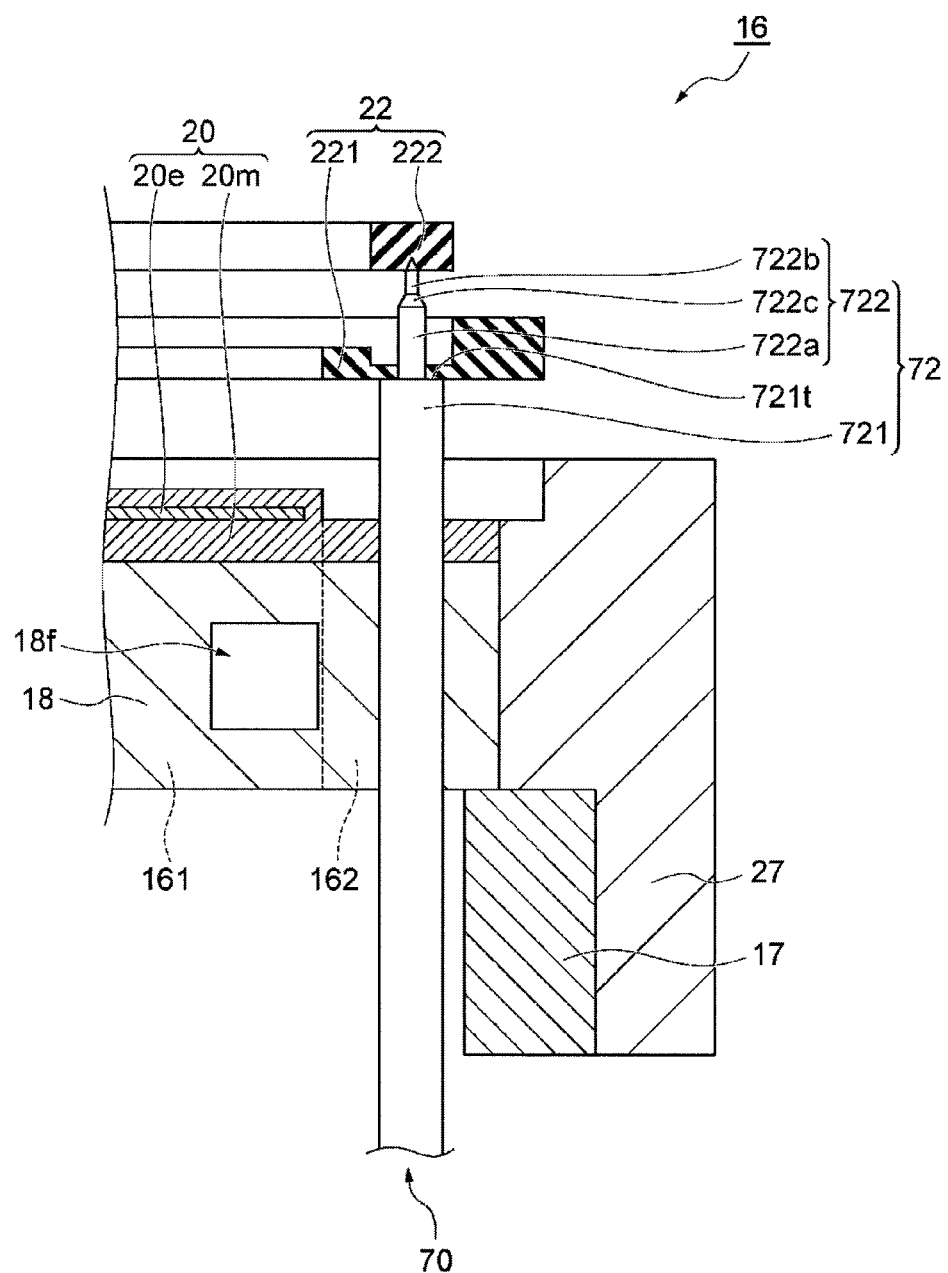
Figure 8:
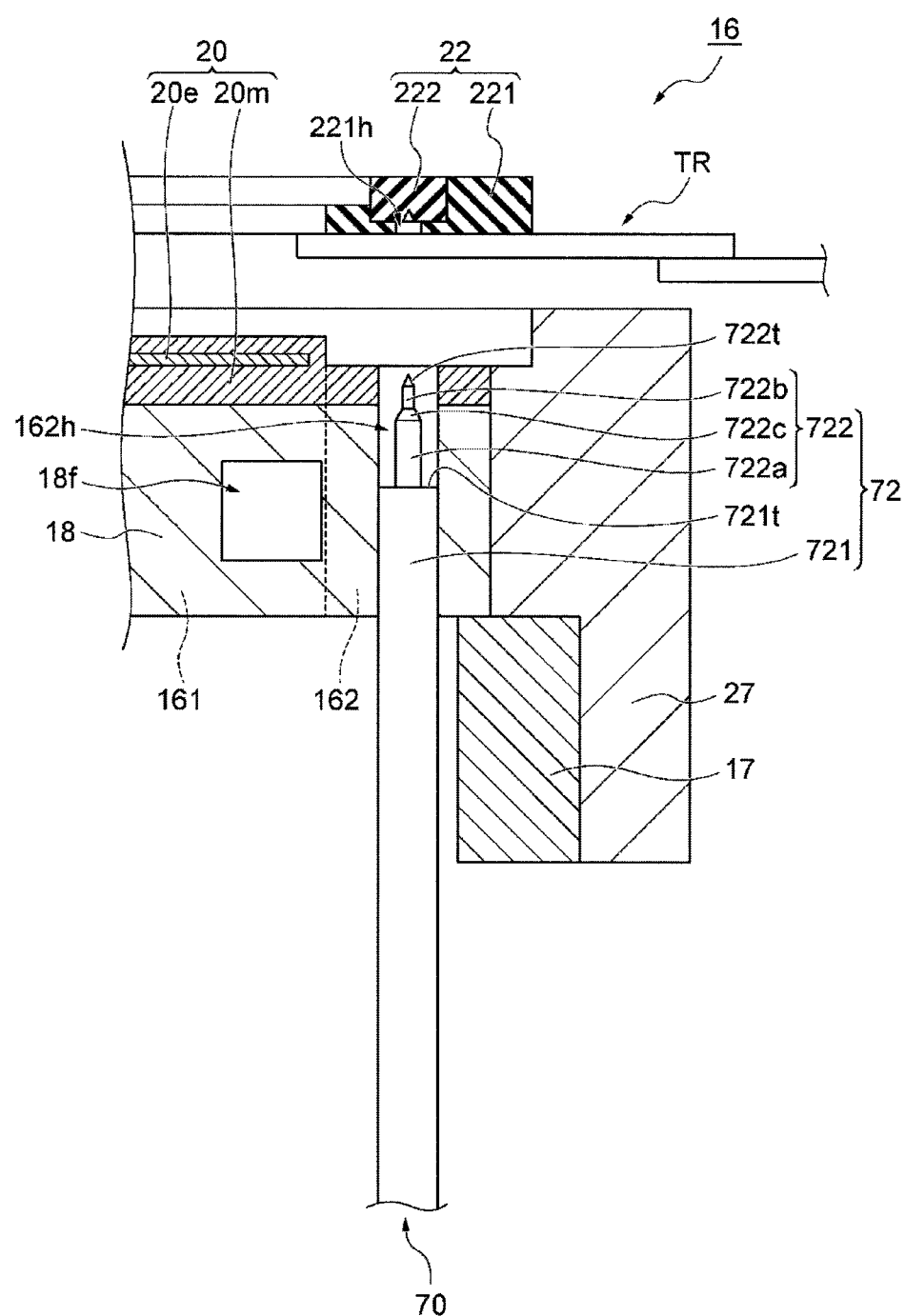

Hereinafter, FIGS. 5 to 8 will be referred to. FIGS. 5 to 8 are partial enlarged views of the substrate support according to the embodiment. FIGS. 5 to 8 show cross-sectional views of the substrate support. In FIG. 5, only the second ring 222 is lifted upward from the substrate support 16. FIG. 6 shows a state in which the first upper end surface 721t of the lift pin 72 is in contact with the first ring 221. FIG. 7 shows a state in which both of the first ring 221 and the second ring 222 are lifted upward from the substrate support 16. FIG. 8 shows a state in which the first ring 221 and the second ring 222 are transferred from the lift pins 72 of the lift mechanism 70 to the transfer robot.

As shown in FIG. 5, in accordance with the substrate support 16, only the second ring 222 in contact with the second upper end surface 722t of the lift pin 72 can be lifted by the lift mechanism 70 in a state where the first upper end surface 721t of the lift pin 72 is not in contact with the first ring 221. By adjusting the height position of only the second ring 222 by the lift mechanism 70, a height position of a boundary between plasma and a sheath can be adjusted. Accordingly, characteristics of plasma processing performed on the edge of the substrate W can be adjusted.

Only the second ring 222 can be lifted upward from the substrate support 16 by the lift mechanism 70. Then, the second ring 222 can be transferred from the lift pins 72 to a handler of the transfer robot and can be unloaded from the chamber 10 by the transfer robot. Next, a new second ring 222 can be transferred into the chamber 10 by the transfer robot and the new second ring 222 can be disposed on the mounting region 221m by the lift mechanism 70.

In one embodiment, the second ring 222 is disposed in the recess on the mounting region 221m. In accordance with the present embodiment, positioning accuracy of the second ring 222 with respect to the first ring 221 and the substrate support 16 is improved.

In one embodiment, the second ring 222 is supported by the lift pins 72 in a state where the tip end of the second columnar portion 722 of each lift pin 72 is fitted into the corresponding recess 222r of the second ring 222. Therefore, the movement of the second ring 222 with respect to the lift pin 72 in the horizontal plane is suppressed. Accordingly, the positioning accuracy of the second ring 222 with respect to the lift pins 72 is improved, which results in improvement of the positioning accuracy of the second ring 222 on the first ring 221 and the substrate support 16.

When the lift pins 72 supporting the second ring 222 are lifted further upward, the first upper end surface 721t of each lift pin 72 is brought into contact with the first ring 221 as shown in FIG. 6. In other words, when the lift pins 72 are further lifted upward, the first upper end surface 721t is in contact with the first ring 221 and the second upper end surface 722t is in contact with the second ring 222. In this state, as shown in FIG. 7, the first ring 221 and the second ring 222 can be simultaneously lifted upward from the substrate support 16 by the lift mechanism 70. Therefore, in accordance with the substrate support 16, it is possible to lift only one of the two rings forming the edge ring 22 and to simultaneously lift the two rings with a small number of lift pins 72.

As shown in FIG. 8, the edge ring 22 can be transferred from the lift pins 72 to the handler of the transport robot TR by moving the handler of the transfer robot TR to a position below the edge ring 22 and lowering the lift pins 72 downward. Then, the edge ring 22 can be unloaded from the chamber 10 by the transfer robot TR. Next, the edge ring 22 in which one or both of the first ring 221 and the second ring 222 are replaced with new one(s) can be transferred into the chamber 10 by the transfer robot TR and disposed on the second region 162 by the lift mechanism 70.

In one embodiment, as described above, the second columnar portion 722 of each lift pin 72 has a first portion 722a and a second portion 722b. The first portion 722a extends upward from the first columnar portion 721 and has a width greater than that of the second portion 722b. In the present embodiment, as shown in FIG. 7, the first ring 221 is supported by the lift pin 72 in a state where the first portion 722a is partially disposed in the through-hole 221h. The first portion 722a is a portion of the second columnar portion 722 that has a relatively large width/diameter. Therefore, the movement of the first ring 221 with respect to the lift pin 72 in the horizontal plane is suppressed. Accordingly, the positioning accuracy of the first ring 221 on the substrate support 16 is improved.

Hereinafter, a method MT including the cleaning of the edge ring will be described with reference to FIG. 9. FIG. 9 is a flowchart of a method including the cleaning of the edge ring according to an embodiment. Hereinafter, the control of the respective components of the plasma processing apparatus 1 by the controller MC for executing the method MT will be also described.

In one embodiment, the method shown in FIG. 9 may be performed when one or both of first ring 221 and second ring 222 are replaced with new ones. Each of the first ring 221 and the second ring 222 is replaced when the replacement is required as a result of the plasma processing performed by the plasma processing apparatus 1.

The controller MC can determine that the first ring 221 needs to be replaced when a period of time in which the first ring 221 has been used in the plasma processing is longer than or equal to a first reference time period. The controller MC can determine that the second ring 222 needs to be replaced when a period of time in which the second ring 222 has been used in the plasma processing is longer than or equal to a second reference time period. The second reference time period may be shorter than the first reference time period.

Alternatively, the controller MC can determine that the first ring 221 needs to replaced when a thickness of the first ring 221 detected by an optical sensor is smaller than or equal to a first reference thickness. The controller MC can determine that the second ring 222 needs to be replaced when a thickness of the second ring 222 detected by the optical sensor is smaller than or equal to a second reference thickness. The optical sensor may be an optical interferometer.

Alternatively, the controller MC can determine that the first ring 221 needs to be replaced when a torque of a motor of the driving unit 74 required to lift the edge ring 22 upward from the substrate support 16 is smaller than or equal to a first reference torque. Alternatively, the controller MC can determine that both of the first ring 221 and the second ring 222 need to be replaced when the torque of the motor of the driving unit 74 required to lift the edge ring 22 upward from the substrate support 16 is smaller than or equal to a second reference torque. The controller MC can determine that the second ring 222 needs to be replaced when the torque of the motor of the driving unit 74 required to lift the second ring 222 upward from the substrate support 16 is smaller than or equal to a third reference torque.

In step ST1 of the method MT, the second ring 222 or the edge ring 22, i.e., both of the first ring 221 and the second ring 222, is lifted upward from the substrate support 16 while being supported by the lift pins 72. In step ST1, the controller MC controls the driving unit 74 of the lift mechanism 70 to lift the second ring 222 or the edge ring 22 upward from the substrate support 16. As a result of the execution of step ST1, the second ring 222 is disposed above the substrate support 16 as shown in FIG. 6. Alternatively, as a result of the execution of step ST1, both of the first ring 221 and the second ring 222 are disposed above the substrate support 16 as shown in FIG. 7.

In subsequent step ST2, plasma is generated from a cleaning gas in the chamber 10 in a state shown in FIG. 6 or 7. Then, the second ring 222 or the edge ring 22 is cleaned by chemical species from the plasma. Substances attached to the second ring 222 or the edge ring 22 can be removed by the cleaning in step ST2. In step ST2, the controller MC controls the gas supply unit GS to supply the cleaning gas into the chamber 10. In step ST2, the controller MC controls the gas exhaust unit 50 to set a pressure in the chamber 10 to a specified pressure. In step ST2, the controller MC controls an energy source, i.e., the radio frequency power supply 61 and/or 62, of the plasma processing apparatus 1 to generate plasma from the cleaning gas in the chamber 10.

In subsequent step ST3, the second ring 222 or the edge ring 22 is transferred from the chamber 10 by the transfer robot. The transfer robot can be controlled by the controller MC. Since the substances attached to the second ring 222 or the edge ring 22 have been removed by the cleaning in step ST2 as described above, contamination of a transfer path of the second ring 222 or the edge ring 22 outside the chamber 10 is suppressed.

In subsequent step ST4, replacement parts corresponding to one or both of the first ring 221 and the second ring 222 are loaded into the chamber 10 by the transfer robot. The replacement parts may be new or unused parts. The replacement parts are transferred from the handler of the transfer robot to the lift pins 72 of the lift mechanism 70. Then, the lift pins 72 are lowered to place the replacement parts on the substrate support 16. In step ST4, the transfer robot and the driving unit 74 of the lift mechanism 70 can be controlled by the controller MC.

In one embodiment, the controller MC is configured to control the driving unit 74 such that both of the first ring 221 and the second ring 221 or only the second ring 222 is lifted upward from the substrate support 16 by the lift pins 72. For example, the controller MC is configured to control the driving unit 74 such that both of the first ring 221 and the second ring 222 are lifted upward from the substrate support 16 by the lift pins 72. Further, for example, the controller MC controls the driving unit 74 such that only the second ring 222 is lifted upward from the substrate support 16 by the lift pins 72 in a state where the first ring 221 is disposed on the substrate support 16.

In one embodiment, the controller MC is configured to control the gas supply unit GS to supply a cleaning gas into the chamber 10 and to control the energy source (the radio frequency power supply 61) to generate plasma from the cleaning gas. Such controls are performed in a state where both of the first ring 221 and the second ring 222 or only the second ring 222 is lifted upward from the substrate support 16. For example, such controls are performed in a state where both of the first and second rings 221 and 222 are lifted upward from the substrate support 16. Further, for example, such controls are performed in a state where the first ring 221 is disposed on the substrate support 16 and the second ring 222 is lifted upward from the substrate support 16.

While various embodiments have been described above, various omissions, substitutions, and changes may be made without being limited to the above-described embodiments. Further, other embodiments can be implemented by combining elements in different embodiments.

For example, a recess may be formed in one of the first ring 221 and the second ring 222, and a protrusion to be fitted into the recess may be formed in the other ring. In this case, the positioning accuracy of the first ring 221 and the second ring 222 is improved.

Further, the plasma processing apparatus including the substrate support 16 is not limited to the plasma processing apparatus 1. The plasma processing apparatus including the substrate support 16 may be a capacitively coupled plasma processing apparatus different from the plasma processing apparatus 1. Alternatively, the plasma processing apparatus including the substrate support 16 may be another type of plasma processing apparatus such as an inductively coupled plasma processing apparatus, a plasma processing apparatus for generating plasma using surface waves such as microwaves, or the like.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A substrate support comprising:
a main body having a substrate supporting region and an annular region surrounding the substrate supporting region;
a first ring disposed on the annular region and having a through-hole;
a second ring disposed on the first ring and having an inner peripheral surface facing an end surface of a substrate on the substrate supporting region; and
a lift pin including a lower rod and an upper rod,
wherein the lower rod has an upper end surface to be in contact with the first ring, and
the upper rod extends upward from the upper end surface of the lower rod to be in contact with the second ring through the through-hole of the first ring and has a length greater than a length of the through-hole,
wherein the first ring includes an inner peripheral region, an intermediate mounting region in which the through-hole is formed and an outer peripheral region, an upper surface of the intermediate mounting region positioned lower than an upper surface of the inner peripheral region and an upper surface of the outer peripheral region, and
the first ring defines a recess on the intermediate mounting region which receives the second ring on the intermediate mounting region fitted in the recess.

2. The substrate support of claim 1, wherein the upper rod is thinner than the lower rod.

3. The substrate support of claim 2, wherein each of the lower rod and the upper rod has a cylindrical shape, and
a diameter of the lower rod is greater than a diameter of the upper rod.

4. The substrate support of claim 3, wherein the upper rod includes:
a first portion extending upward from the lower rod;
a second portion extending upward from the first portion and having a tip end,
wherein the first portion is thicker than the second portion.

5. The substrate support of claim 4, wherein each of the lower rod, the first portion, and the second portion has a cylindrical shape, and
the first portion has a diameter that is smaller than the diameter of the lower rod and greater than a diameter of the second portion.

6. The substrate support of claim 5, wherein the upper rod further has a tapered portion between the first portion and the second portion.

7. The substrate support of claim 6, wherein the second ring has a recess into which the tip end of the upper rod is fitted.

8. The substrate support of claim 1, wherein the main body includes a base and an electrostatic chuck disposed on the base.

9. A plasma processing apparatus comprising:
a chamber;
the substrate support described in claim 1 and disposed in the chamber; and
a driving unit configured to raise and lower the lift pin.

10. The plasma processing apparatus of claim 9, further comprising:
a gas supply unit configured to supply a cleaning gas into the chamber;
an energy source configured to supply energy for generating plasma from the cleaning gas into the chamber; and
a controller,
wherein the controller is configured
to control the driving unit such that both of the first ring and the second ring or only the second ring is lifted upward from the substrate support by the lift pin, and
to control the gas supply unit to supply the cleaning gas into the chamber and the energy source to generate plasma from the cleaning gas in a state where both of the first ring and the second ring or only the second ring is lifted upward from the substrate support.

11. A plasma processing apparatus comprising:
a plasma processing chamber;
a substrate support disposed in the plasma processing chamber, the substrate support including;
a main body having a substrate supporting region and an annular region surrounding the substrate supporting region;
a first ring disposed on the annular region, the first ring having an inner portion, an intermediate portion and an outer portion, the intermediate portion having a plurality of through-holes;
a second ring disposed on the intermediate portion of the first ring, a radially outer edge of the second ring being surrounded by the outer portion of the first ring; and
a plurality of lift pins corresponding to the respective through-holes, each lift pin having a lower portion and an upper portion, the lower portion being configured to support the first ring, and the upper portion being configured to support the second ring through the corresponding through-hole; and
a driving unit configured to vertically move the plurality of lift pins.

12. The plasma processing apparatus of claim 11, wherein the first ring has a recess defined by an outer sidewall of the inner portion, an upper surface of the intermediate portion and an inner sidewall of the outer portion, and the second ring is fitted in the recess.

13. The plasma processing apparatus of claim 11, wherein the second ring has a plurality of recesses at a lower surface of the second ring, the plurality of recesses correspond to the respective lift pins, and the upper portion of the lift pin is configured to support the second ring in the corresponding recess.

14. The plasma processing apparatus of claim 11, wherein the intermediate portion of the first ring is positioned radially outside of the inner portion of the first ring.

15. The plasma processing apparatus of claim 11, wherein a radially outer edge of the inner portion of the first ring is surrounded by the second ring.

16. The substrate support of claim 1, wherein the inner peripheral region of the first ring has a first thickness that extends from a bottom surface of the inner peripheral region to the upper surface of the inner peripheral region, the intermediate mounting region of the first ring has a second thickness that extends from a bottom surface of the intermediate peripheral region to the upper surface of the intermediate mounting region, and the outer peripheral region of the first ring has a third thickness that extends from a bottom surface of the outer peripheral region to the upper surface of the outer peripheral region, and
wherein the bottom surface of the inner peripheral region, the bottom surface of the intermediate mounting region, and the bottom surface of the outer peripheral region form a single horizontal plane on a bottom surface of the first ring, and the first and third thicknesses are greater than the second thickness.

17. The plasma processing apparatus of claim 10, wherein the controller is configured to:
control the driving unit such that both of the first ring and the second ring or only the second ring is lifted upward from the substrate support by the lift pin for removal of the first ring and the second ring or only the second ring from the processing apparatus, and
control the driving unit such that only the second ring is lifted upward from the substrate support by the lift pin to adjust a height position of a boundary between plasma and sheath during plasma processing.

18. The substrate support of claim 8, wherein the first ring is positioned on the electrostatic chuck.

19. The substrate support according to claim 1, wherein at least part of each of the inner region, the intermediate region and the outer region is supported on the annular region of the main body.

* * * * *